(12) United States Patent
Yokokawa et al.

(10) Patent No.: US 9,755,126 B2
(45) Date of Patent: Sep. 5, 2017

(54) LIGHT SOURCE UNIT

(71) Applicant: USHIO DENKI KABUSHIKI KAISHA, Tokyo (JP)

(72) Inventors: Yoshihisa Yokokawa, Himeji (JP); Yoshihiro Kanahashi, Himeji (JP); Manabu Mori, Himeji (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 466 days.

(21) Appl. No.: 14/417,620

(22) PCT Filed: Jun. 26, 2013

(86) PCT No.: PCT/JP2013/067494
§ 371 (c)(1),
(2) Date: Jan. 27, 2015

(87) PCT Pub. No.: WO2014/021030
PCT Pub. Date: Feb. 6, 2014

(65) Prior Publication Data
US 2015/0221841 A1     Aug. 6, 2015

(30) Foreign Application Priority Data

Jul. 30, 2012   (JP) .................................. 2012-168521
Jul. 30, 2012   (JP) .................................. 2012-168522

(51) Int. Cl.
*H01J 1/62*       (2006.01)
*H01L 33/62*      (2010.01)
(Continued)

(52) U.S. Cl.
CPC ............ *H01L 33/62* (2013.01); *F21V 23/005* (2013.01); *F21V 23/06* (2013.01); *F21V 29/70* (2015.01);
(Continued)

(58) Field of Classification Search
CPC .......... H01L 33/62; H01L 33/08; F21V 29/70; F21V 23/005; F21V 26/06
(Continued)

(56) References Cited

U.S. PATENT DOCUMENTS 7,690,781 B2   4/2010   Ohnishi
7,931,387 B2   4/2011   Song
(Continued)

FOREIGN PATENT DOCUMENTS

JP   H07-45641 A     2/1995
JP   H10-247748 A    9/1998
(Continued)

OTHER PUBLICATIONS

An Office Action issued by the Japan Patent Office dated Dec. 18, 2014, which corresponds to Japan Patent Application No. 2012-168521.
(Continued)

*Primary Examiner* — Vip Patel
(74) *Attorney, Agent, or Firm* — Studebaker & Brackett PC

(57) ABSTRACT

A light source unit includes a plurality of LED elements disposed on a plurality of band-shaped wirings on a substrate. The LED elements on one band-shaped wiring are electrically connected by wires to an adjacent band-shaped wiring. The LED elements are disposed on the substrate in a staggered arrangement as a whole. The LED elements can be densely disposed without poor connection occurring in the wires connected to the band-shaped wirings, and effective cooling can be carried out without impeding the dissipation of heat from the LED elements. One or more damming channels are formed between each two adjacent LED elements on each band-shaped wiring. A non-effusion region is formed, into which no solder flows, between each two
(Continued)

adjacent LED elements. The wires are connected to the non-effusion regions.

17 Claims, 15 Drawing Sheets

(51) Int. Cl.
| | | |
|---|---|---|
| *H01L 25/075* | (2006.01) | |
| *H01L 23/00* | (2006.01) | |
| *F21V 29/70* | (2015.01) | |
| *F21V 23/00* | (2015.01) | |
| *F21V 23/06* | (2006.01) | |
| *H01L 33/08* | (2010.01) | |
| *F21Y 105/10* | (2016.01) | |
| *F21Y 115/10* | (2016.01) | |

(52) U.S. Cl.
CPC .......... *H01L 24/32* (2013.01); *H01L 25/0753* (2013.01); *H01L 33/08* (2013.01); *F21Y 2105/10* (2016.08); *F21Y 2115/10* (2016.08); *H01L 2224/26175* (2013.01); *H01L 2224/27013* (2013.01); *H01L 2224/48091* (2013.01); *H01L 2224/73265* (2013.01)

(58) Field of Classification Search
USPC .................................. 313/500, 498, 506, 512
See application file for complete search history.

(56) References Cited

U.S. PATENT DOCUMENTS

| | | |
|---|---|---|
| 2002/0190262 A1 | 12/2002 | Nitta et al. |
| 2009/0189165 A1 | 7/2009 | Song |
| 2010/0201773 A1 | 8/2010 | Ohnishi |
| 2013/0056767 A1 | 3/2013 | Tanaka |

FOREIGN PATENT DOCUMENTS

| | | |
|---|---|---|
| JP | 2001-298033 A | 10/2001 |
| JP | 2002-177302 A | 6/2002 |
| JP | 2002-314143 A | 10/2002 |
| JP | 2004-358769 A | 12/2004 |
| JP | 2006-108517 A | 4/2006 |
| JP | 3142971 U | 6/2008 |
| JP | 2008-288231 A | 11/2008 |
| JP | 2011-134902 A | 7/2011 |
| JP | 2011-146646 A | 7/2011 |
| JP | 2012-084733 A | 4/2012 |
| WO | 2008/069204 A1 | 6/2008 |

OTHER PUBLICATIONS

An Office Action issued by the Japan Patent Office dated Dec. 18, 2014, which corresponds to Japan Patent Application No. 2012-168522.

International Search Report; PCT/JP2013/067494; dated Aug. 13, 2013.

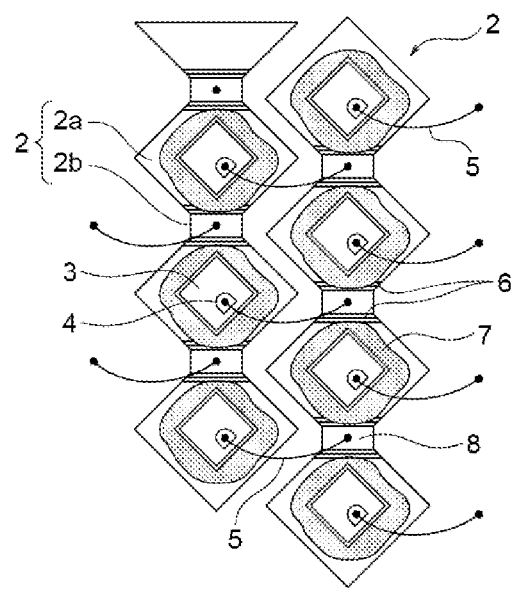
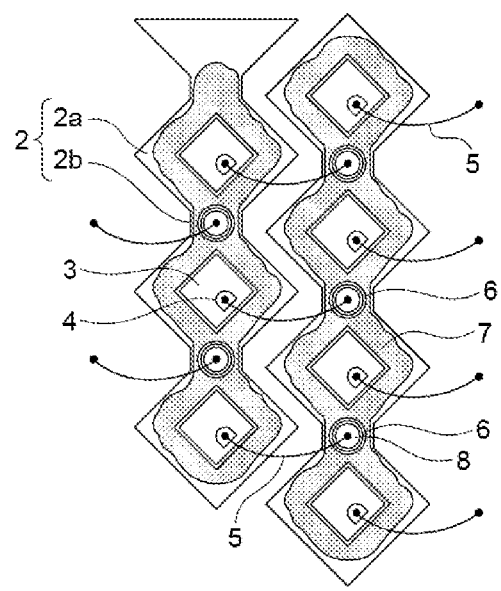

X-DIRECTION

X-DIRECTION

X-DIRECTION

LIGHT SOURCE UNIT

TECHNICAL FIELD

The present invention relates to a light source unit, and more particularly a light source unit that has a substrate and a plurality of LED elements on the substrate.

BACKGROUND ART

Conventionally, in the printing industry and electronics industry, a light source that can emit ultraviolet light is often used as a light source to cure, dry, melt, soften or reform an object to be treated (e.g., a protection film, an adhesive, painting, an ink, a photoresist, resin, and oriented film). In recent years, an LED element is becoming popular as the light source that emits light in an ultraviolet range (UV range). An ultraviolet light source unit that uses the LED element(s) to emit light in the UV range is therefore studied.

One example of a configuration that includes the light source unit having the LED element(s) together with an ink jet head of an ink jet printer is disclosed in Japanese Patent Application Laid-Open Publication No. 2004-358769 (Patent Literature 1; will be mentioned below). FIG. 15 of the accompanying drawings shows this configuration.

An ink jet printer 20 includes an ink jet head 21 to inject an ink to a print medium M such as paper, and ultraviolet light source units 22 located on one side (or both sides) of the ink jet head 21. The ink jet head 21 and the ultraviolet light source units 22 are situated above the print medium M by a predetermined distance, and supported from a guide rail 23 such that the ink jet head and the ultraviolet light source units can move (scan) in a transverse direction X relative to the print medium M.

A UV ink droplet injected from the ink jet head 21 and adhering to the surface of the print medium M is cured by the ultraviolet light emitted from the light source unit(s) 22. Accordingly, the UV ink is successively cured (fixed) on the surface of the print medium M in the scanning direction X of the ink jet head 21.

After the UV ink droplet is cured, the print medium M is moved a prescribed distance in the length direction Y, and the above-mentioned printing is repeated. In this manner, a picture (drawing, painting) or a character (letter) is made on the surface of the print medium M.

In the above-mentioned Patent Literature 1 (Japanese Patent Application Laid-Open Publication No. 2004-358769), the ultraviolet light source unit provided in the ink jet printer has LED elements that are arranged zigzag (staggered). FIG. 16 of the accompanying drawings shows the arrangement of the LED elements. A light irradiation surface of the ultraviolet light source unit 22 has a substrate 222, on which the LED elements 221 are disposed. The LED elements 221 are situated on the substrate 222 zigzag in the longitudinal direction and the transverse direction. With such zigzag arrangement of the LED elements, the ultraviolet light source unit 22 can emit the ultraviolet light uniformly, without gaps, along the traveling path of the ultraviolet light source unit 22 when the ultraviolet light source unit 22 is moved.

If the LED elements 221 are serially connected on the substrate 222, and one of the LED elements 221 is disconnected, then all the remaining LED elements 221 which are serially connected to that LED element are also disconnected. Thus, the light source unit is brought into the unlit condition.

To deal with it, inventors devised a different wiring arrangement as shown in FIG. 17. In FIG. 17, a plurality of parallel linear or narrow strip-like wirings 12 are arranged in the same direction on the substrate 11. A plurality of LED elements 13 are connected to each of the strip-like wirings 12 by soldering. When the substrate 11 is viewed as a whole, the LED elements 13 are arranged zigzag. Each of the LED elements 13 on each strip-like wiring 12 has an upper face electrode 14, and a wire 15 extending from the upper face electrode 14 is electrically connected to a region 16 of a next strip-like wiring 12 between each two adjacent LED elements 13 on that strip-like wiring 12 by wire bonding.

With such configuration, each strip-like wiring 12 becomes a common electrode for the LED elements 13 disposed on that strip-like wiring 12. Thus, the LED elements 13 on each strip-like wiring 12 are electrically connected in parallel to each other.

Such wiring configuration brings about an advantage that even when one of the wires 15 of the LED elements 13 is disconnected, other LED elements are not unlit correspondingly.

It was found, however, that when the above-described configuration was actually tried, wire connection (wire bond) between the LED elements and the strip-like wirings suffered from poor connection.

This shortcoming will be described with reference to FIGS. 18(A) and 18(B) of the accompanying drawings.

As described above, the LED elements 13 are joined to the strip-like wirings 12 by soldering, and the LED elements 13 on one strip-like wiring are connected to the neighboring strip-like wiring 12 at the regions 16 between the LED elements 13 on that strip-like wiring 12 by the wires 15. When the LED elements 13 on one strip-like wiring are soldered to the strip-like wiring 12 on the neighboring strip-like wiring, the solder 17 and fluxes contained in the solder 17 are melted, and flow from the lower faces of the LED elements 13. It is difficult to control (regulate) the outflow of the solder 17. Also, the LED elements 13 are arranged at intervals as small as possible from the viewpoint of reducing the installation areas of the LED elements 13. Thus, the solder 17 that is used to connect one LED element 13 often becomes continuous to the spilled solder from an adjacent LED element 13.

As shown in FIGS. 18(A) and 18(B), if the solder 17 of one LED element 13 becomes continuous to the solder 17 of an adjacent LED element 13 on one strip-like wiring, there is the solder 17 on the region 16 between these two LED elements 13. The wire 15 extending from the upper face electrode 14 of the LED element 13 on one strip-like wiring 12 is bonded to such region 16 on an adjacent strip-like wiring by wire bonding. However, because the solder 17 is present on the region 16, the wire 15 cannot be properly bonded to the region 16. This results in poor wire connection.

When the above-described ink jet printer should have a faster printing speed to increase the processing speed, the ink jet and the light source unit need to move quickly in the transverse direction X. However, when the light source unit is moved quickly in the X-direction, an amount of ultraviolet light irradiation that is directed to the UV ink droplet injected from the ink jet head per unit time becomes smaller. Accordingly, the ink is not cured sufficiently. In order to completely cure the ink on one hand and increase the processing speed on the other hand, it is necessary to increase an amount of ultraviolet light irradiation. To achieve this, the LED elements need to be disposed at a high density in a prescribed area on the substrate.

In order to realize the high density arrangement of the LED elements in the light source unit, the inventors studied the possible high density arrangement of the LED elements and the strip-like wirings on the substrate, i.e., the inventors studied the above-described configuration as shown in FIG. 17.

As shown in FIG. 19, which is a cross-sectional view taken along the line A-A in FIG. 17, the LED element 13 has the electrode 14 on its upper face and the electrode 18 on its lower face. The electrode 18 attached to the lower face is connected to the strip-like wiring 12 by soldering or the like. The electrode 14 attached to the upper face is connected to the adjacent strip-like wiring 12 between the LED elements 13 by the wire 15.

The strip-like wirings 12 should be insulated from each other such that the electric circuits formed by the respective strip-like wirings 12 are insulated from each other. Thus, the strip-like wirings 12 are spaced from each other at prescribed intervals for insulation (gaps for insulation). The heat sink HS is provided in contact with the lower face of the substrate 11. Heat of the substrate is radiated from the heat sink HS with the cooling air from a cooling fan. Thus, the substrate 11 is cooled. With such configuration, the heat generated from the LED elements 13 is radiated through the lower face electrode 18, the strip-like wiring 12, the substrate 11 and the heat sink HS in this order (heat radiation route from the LED lower face electrode to the heat sink).

When the configuration of FIG. 17 is employed, the strip-like wirings 12 should have the prescribed insulation gaps (should be spaced from each other). In the end, this becomes an obstacle, i.e., this makes it difficult to arrange the LED elements 13 on the strip-like wirings 12 at a high density in the X-direction perpendicular to the longitudinal direction of the strip-like wirings 12.

To deal with this, the width of each strip-like wiring 12 may be made smaller than the width of the LED element 13. Such strip-like wirings 12 may be arranged in parallel, and the LED elements 13 may be disposed on the strip-like wirings 12 to increase the arrangement density (installation density) of the LED elements 13 in the X-direction.

FIG. 20 illustrates the above-described structure. In this drawing, each of the strip-like wirings 12 on the substrate 11 has a smaller width than each LED element 13. A plurality of LED elements 13 are arranged on each wiring 12.

Because the width of each of the strip-like wirings 12 is reduced, the insulation gap between each two adjacent wirings 12 is reduced, as compared to the configuration shown in FIG. 17, even if the wirings 12 are spaced from each other at the prescribed insulation gaps. Accordingly, the LED elements 13 disposed on the wirings 12 may be arranged at a higher density in the X-direction, which is perpendicular to the longitudinal direction of the wirings 12.

When the above-described configuration is employed, however, the width L1 of the strip-like wiring 12 on the substrate 11 becomes smaller than the width of the LED element 13, as shown in FIG. 21 which is the cross-sectional view taken along the line A-A in FIG. 20. If the installation density should be further reduced in the X-direction of FIG. 20, then the width L1 would become smaller than the width L2 of the lower face electrode 18 of the LED element 13 (L1<L2). This makes the heat radiation route from the LED element 13 to the heat sink HS narrow(er) at the strip-like wiring 12, and deteriorates the heat radiation capability. As a result, a sufficient cooling effect is not given to the LED elements, and the luminous efficacy (light emission efficiency) of the LED elements drops.

LISTING OF REFERENCES

Patent Literatures

PATENT LITERATURE 1: Japanese Patent Application Laid-Open Publication No. 2004-358769

SUMMARY OF THE INVENTION

Problems to be Solved by the Invention

In view of the above-described problems in the art, the present invention intends to provide a light source unit that includes a substrate, a plurality of parallel strip-like wirings on the substrate, and a plurality of LED elements on the strip-like wirings, and that does not suffer from the poor connection. The LED elements soldered onto one strip-like wiring are electrically connected to an adjacent strip-like wiring by wires. The LED elements are arranged, as a whole, on the substrate in a staggered manner. The wires extending from the LED elements on one strip-like wiring are reliably connected to an adjacent strip-like wiring, and therefore poor connection does not occur.

Also, the present invention intends to provide a configuration that can increase the installation density of the LED elements on the substrate, and can ensure the sufficient cooling to the LED elements to prevent the drop of the luminous efficacy.

Solution to the Problems

In order to overcome the above-mentioned problems, the light source unit according to one aspect of the present invention includes one or more damming grooves (intercepting grooves, halting grooves) between each two adjacent LED elements on each strip-like wiring. The damming groove(s) form(s) a non-effusion region (no-solder-effusing region) between each two adjacent LED elements. The non-effusion region is a region into which no solder flows. The wires are electrically connected to the non-effusion regions.

Two damming grooves may be formed between each two adjacent LED elements on each strip-like wiring. The two damming grooves may extend transversely across the strip-like wiring concerned, and form the non-effusion region between the two damming grooves.

Each damming groove may include a series of dot-like concaves that extend transversely across the strip-like wiring concerned.

Each of the damming grooves may be an annular groove formed between each two adjacent LED elements on each strip-like wiring, and the annular groove may form the non-effusion region therein.

Each of the damming grooves may be an annular groove that surrounds each LED element, and the annular groove may form the non-effusion region outside the annular groove.

Two L-shaped damming grooves may be formed in the vicinity of diagonally opposite corners of each LED element. The L-shaped grooves may be formed outside the associated LED element. The non-effusion region may be formed outside the L-shaped grooves.

According to another aspect of the present invention, each strip-like wiring of the light source unit has wide parts (large parts) and narrow parts (small parts) in a wiring direction (longitudinal direction of the strip-like wiring). The LED elements are disposed on the wide parts of the strip-like wirings.

The LED elements are disposed on the wide parts of the strip-like wirings. Damming grooves may be formed in each strip-like wiring such that at least one damming groove is provided between each two adjacent LED elements on each strip-like wiring. Non-effusion regions, into which no solder flows, may be formed on the narrow parts.

Each of the wide parts of each strip-like electrode may be wider than a lower face electrode provided on a lower face of each LED element. The lower face electrode may be in contact with the associated strip-like wiring.

Each of the narrow parts of each strip-like electrode may be narrower than each LED element.

Each LED element may have a square shape, and one side of the square shape may be parallel to the wiring direction (longitudinal direction) of the strip-like wiring concerned.

Each LED element may have a square shape, and a diagonal line of the square shape may coincide with the wiring direction of the strip-like wirings.

Advantageous Effects of the Invention

In the light source unit according to one aspect of the present invention, one or more damming grooves (intercepting grooves, halting grooves) are formed between each two adjacent LED elements on each strip-like wiring. The damming groove(s) form(s) the non-effusion region between each two adjacent LED elements. The non-effusion region is a region into which the solder does not flow. The wires are electrically connected to the non-effusion regions. Therefore, when the wires extending from the LED elements disposed on one strip-like wiring are connected to a next strip-like wiring, it is possible to connect the wires directly onto the strip-like wiring without being hindered by the solder. Accordingly, an advantage of no poor connection is obtained.

Thus, when the LED elements are soldered, no concern is necessary about accidental connection between adjacent LED elements by the solder. Consequently, it is possible to install (arrange) the LED elements on the strip-like wirings at a high density.

In the light source unit according to another aspect of the present invention, each strip-like wiring has the wide parts and the narrow parts. Thus, it is possible to position the strip-like wirings closer to each other. Therefore, it is possible to arrange the LED elements of the strip-like wirings on the substrate at a higher density. Because the LED elements are placed on the wide parts of the wiring, it is possible to avoid the deterioration of the luminous efficacy without impairing the cooling effect to be given to the LED elements.

The LED elements may be soldered on the wide parts of the strip-like wirings, one or more damming grooves may be formed between each two adjacent LED elements, and the non-effusion regions may be formed on the narrow parts of the strip-like wirings. The non-effusion region is a region into which no solder flows. With such configuration, the adjacent LED elements are not connected to each by the solder, i.e., the solder belonging to one LED element does not become continuous to the solder belonging to an adjacent LED element. Consequently, it is possible to arrange the LED elements on the substrate at a much higher density without any concerns related to use of such high density configuration.

When the wide part has a greater width than the LED element, it is possible to efficiently radiate the heat from the LED elements. This suppresses the temperature increase of the LED elements and prevents the drop of the luminous efficacy of the LED elements.

It is also possible to increase the installation density of the LED elements in a direction perpendicular to the wiring direction on the substrate if the narrow part has a smaller width than the LED element.

BRIEF DESCRIPTION OF THE DRAWINGS

FIG. 9 is a plan view of a sixth embodiment of the present invention.

FIG. 10 is a plan view of a seventh embodiment of the present invention.

DESCRIPTION OF EMBODIMENTS OF THE INVENTION

Figure 1:
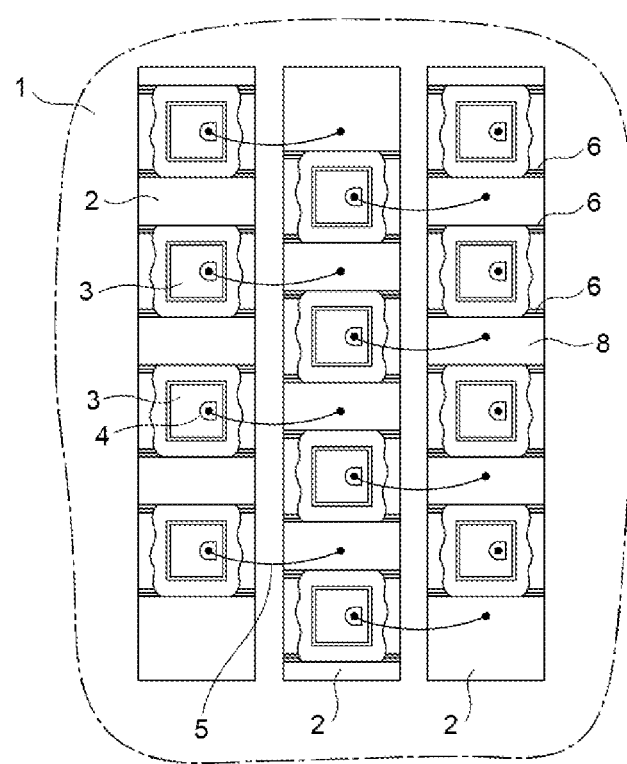
FIG. 1 is a plan view of a light source unit according to a first embodiment of the present invention.
Figure 2A:
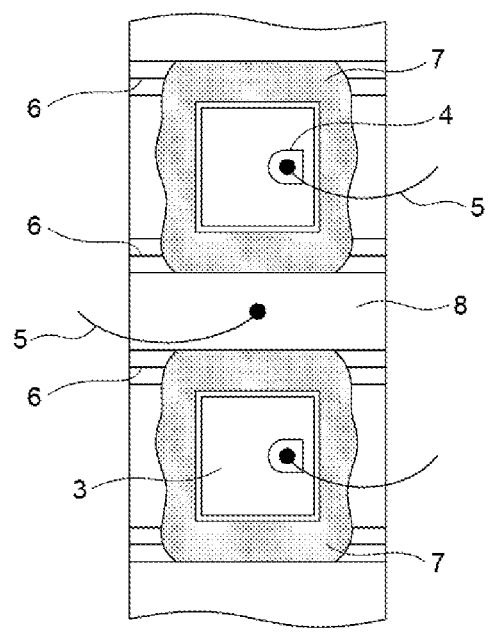
FIG. 2(A) is a partial enlarged view of the light source unit shown in FIG. 1.
Figure 2B:
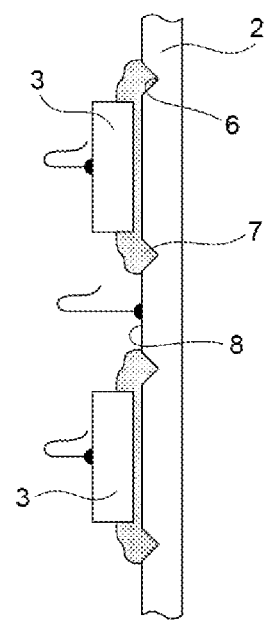
FIG. 2(B) is a cross-sectional view of FIG. 2(A).

FIG. 1 is a plan view of a light source unit according to one embodiment of the present invention. FIG. 2(A) is a partial enlarged view of the light source unit shown in FIG. 1, and FIG. 2(B) is a cross-sectional view of the structure shown in FIG. 2(A).

As illustrated in FIG. 1, a substrate 1 is made from a substance having a high insulation property and a high thermal conductivity (e.g., aluminum nitride), and a plurality of strip-like (band-shaped) metallic wirings 2 are arranged on the substrate 1 at predetermined insulation intervals (gaps for insulation). The material (metal) of the strip-like wiring 2 has a high thermal conductivity such as copper and gold.

A plurality of LED elements 3 are soldered on each of the strip-like wirings 2 such that the LED elements 3 on the neighboring strip-like wirings 2 are arranged zigzag (offset from each other) in the wiring direction. The LED elements 3 on the substrate 1, therefore, have the staggered arrangement, as a whole.

A wire 5 extends from an upper face electrode 4 of each of the LED elements 3, and is connected to a region of an adjacent strip-like wiring 2 between the LED elements 3.

In this embodiment, each of the LED elements 3 has a square shape, with one side of the square being parallel to the wiring direction (longitudinal direction) of the strip-like wiring 2.

In particular, as shown in FIGS. 2(A) and 2(B), two damming grooves 6 (one groove on each side) are formed on both sides of each LED element 3 on the strip-like wiring 2. In other words, there are provided two damming grooves (intercepting grooves, halting grooves) 6 between each two adjacent LED elements 3 on each strip-like wiring 2. The damming grooves 6 extend transversely across the strip-like wiring 2. The cross-sectional shape of the groove 6 is a triangle in the embodiment shown in FIG. 2(B). It should be noted, however, that the cross-sectional shape of the groove 6 is not limited to the triangle. For example, the cross-sectional shape of the groove 6 may be a square, a rectangle, a semicircle, or other suitable shape.

As shown in FIGS. 2(A) and 2(B), when the LED element 3 is soldered to the strip-like wiring 2, the solder 7 flows beyond the contour of the LED element 3, but the solder 7 is blocked (halted) by the damming grooves 6. Thus, the solder 7 does not flow outward beyond the damming grooves 6.

It is satisfactory so long as the depth and size of the damming grooves 6 as well as the number of the damming grooves 6 are decided to allow the damming grooves 6 to have a capacity of preventing the solder 7 from flowing over the damming grooves 6.

In this manner, there is defined a non-effusion region 8 between each two adjacent damming grooves 6. No solder flows in the non-effusion region 8.

The wire 5 extending from the LED element 3 on one strip-like wiring 2 is connected to the non-effusion region 8 of an adjacent strip-like wiring 2.

Figure 3:
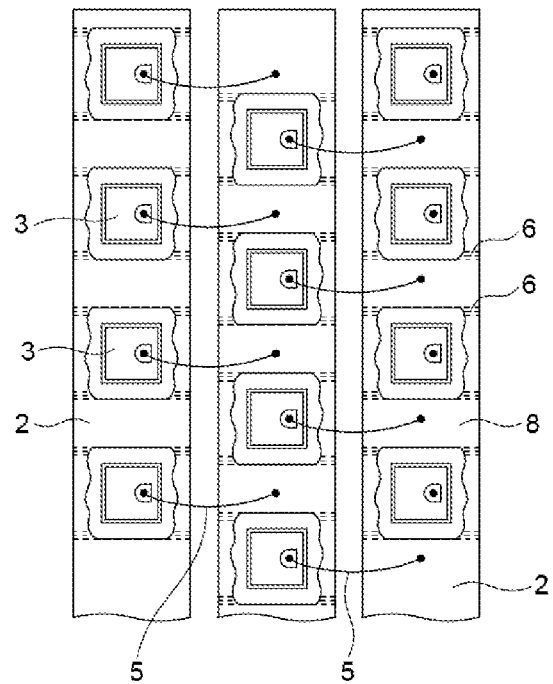
FIG. 3 is a plan view of a second embodiment of the present invention.
Figure 4A:
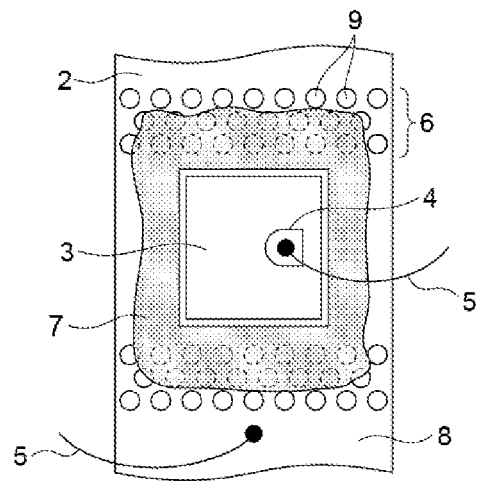
FIG. 4(A) is a partial enlarged view of the light source unit shown in FIG. 3.
Figure 4B:
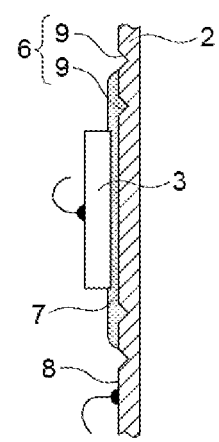
FIG. 4(B) is a cross-sectional view of FIG. 4(A).

FIGS. 3 and 4 illustrate another example of damming grooves 6 according to a second embodiment. As shown in FIGS. 3 and 4, each of the damming grooves (intercepting grooves, halting grooves) 6 formed between each two adjacent LED elements 3 on the strip-like wiring 2 includes a series of dot-like recesses (holes, concaves, pits) 9, unlike the continuous groove in the first embodiment shown in FIG. 1. In the embodiment shown in FIGS. 3 and 4, six dot-like grooves (three grooves on each side) 6 are formed on both sides of each LED element 3.

Figure 5A:
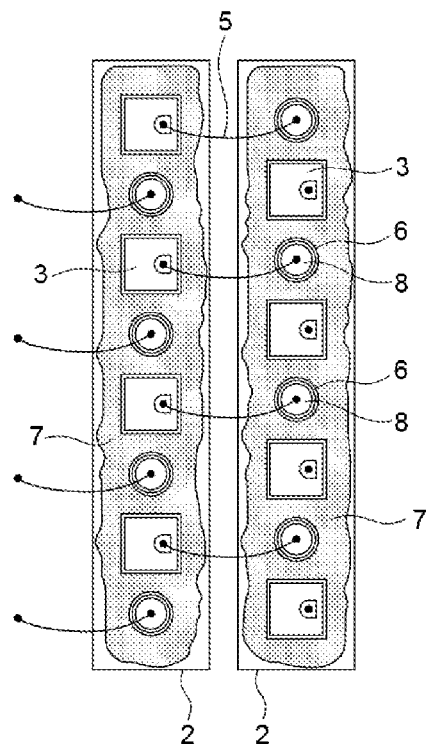
FIG. 5(A) is a plan view of a third embodiment of the present invention.
Figure 5B:
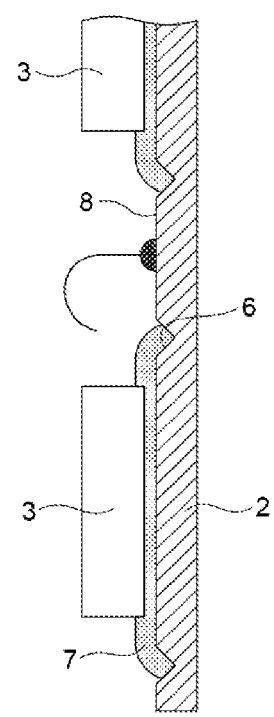
FIG. 5(B) is an enlarged partial cross-sectional view of the light source unit shown in FIG. 5(A).

FIG. 5(A) shows a third embodiment of the damming grooves 6. The damming groove 6 is provided between each two adjacent LED elements 3 on the strip-like wiring 2. The damming groove 6 is an annular groove. When the melted solder 7 flows out from the bottom of the LED element 3, the solder 7 is dammed by the annular groove 6, and the solder 7 does not flow further (inward) over the annular groove 6. Accordingly, the inside area of the annular groove 6 becomes the non-effusion region 8. The wire 5 extending from the LED element 3 on one strip-like wiring 2 is connected to an adjacent strip-like wiring 2 at the non-effusion region 8.

It should be noted that the shape of the annular damming groove 6 is not limited to the circle. For example, the shape of the groove 6 may be a square, a rectangle or other suitable two-dimensional shapes.

Figure 6:
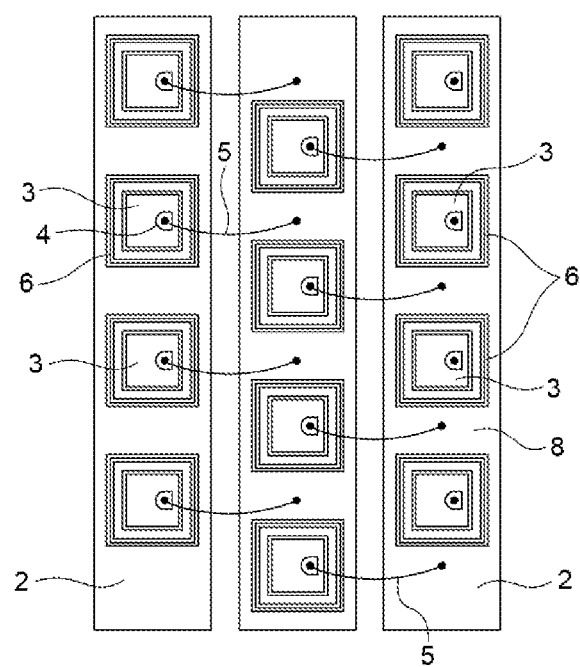
FIG. 6 is a plan view of a fourth embodiment of the present invention.
Figure 7A:
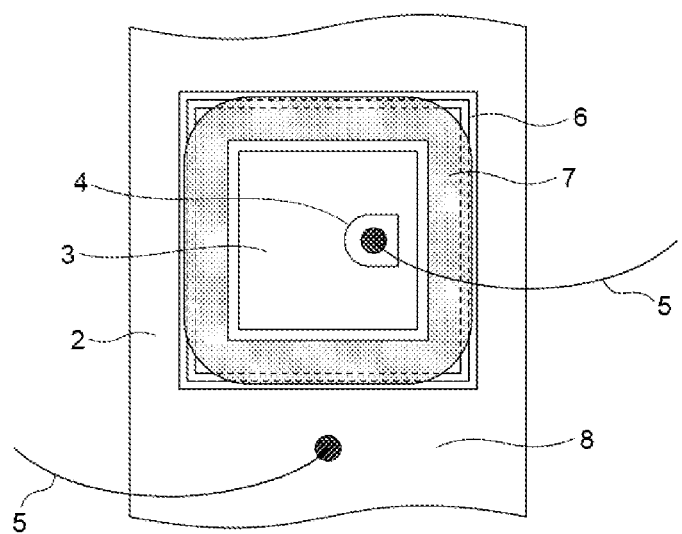
FIG. 7(A) is a partial enlarged view of the light source unit shown in FIG. 6.
Figure 7B:
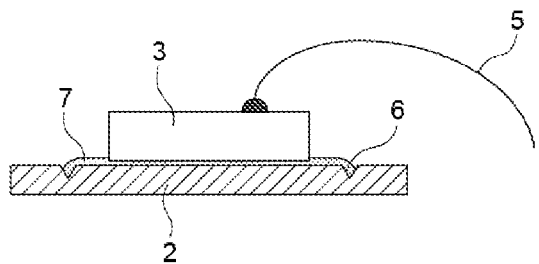
FIG. 7(B) is a cross-sectional view of FIG. 7(A).

FIGS. 6 and 7 show the damming grooves 6 according to a fourth embodiment of the present invention. Each damming groove 6 has an annular shape and surrounds the associated LED element 3. Thus, the outside area of the annular groove 6 defines the non-effusion region 8. As depicted in FIGS. 7(A) and 7(B), when the LED element 3 is soldered, and the melted solder 7 flows out from the bottom of the LED element 3, then the solder 7 is dammed by the annular groove 6. Accordingly, the solder 7 does not further flow outward over the annular groove 6. The outside area of the annular groove 6 defines the non-effusion region 8.

It should be noted that the shape of the annular damming groove 6 is not limited to the square shown in FIG. 7(A). For example, the shape of the groove 6 may be a circle or other suitable shapes.

If the solder 7 can flow in an arbitrary direction without any restriction, there is a possibility that the LED element 3 may turn on the melted solder. However, when the damming groove 6 has the shape shown in the fourth embodiment, the outflow direction of the solder 7 is limited (regulated), and therefore the undesired turning of the LED element 3 is avoided.

Figure 8A:
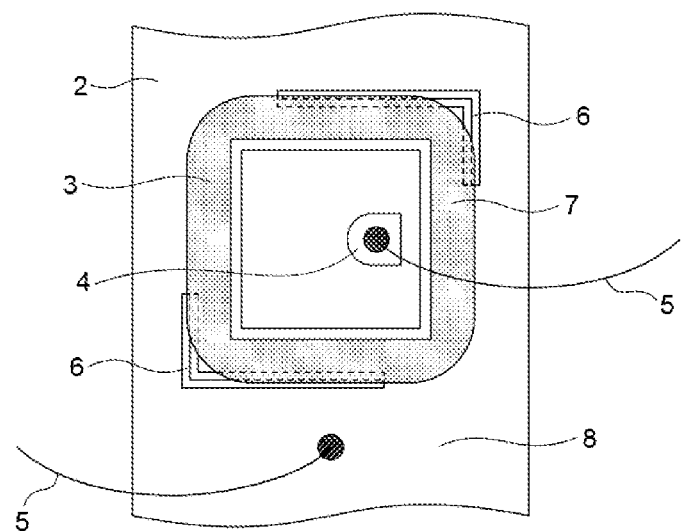
FIG. 8(A) is a partial enlarged view of a fifth embodiment of the present invention.
Figure 8B:
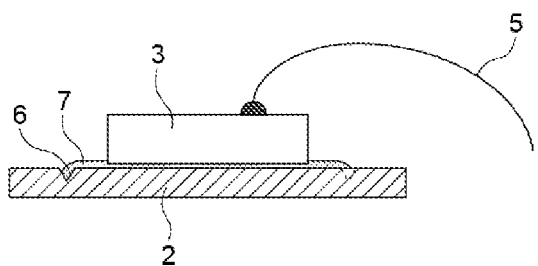
FIG. 8(B) is a cross-sectional view of FIG. 8(A).

FIG. 8(A) shows a damming groove 6 according to a fifth embodiment of the present invention. In this embodiment, a pair of damming grooves 6 are provided in the vicinity of two diagonally opposite corners of the LED element 3. Each of the damming grooves 6 has an approximately "L" shape.

Similar to the fourth embodiment shown in FIG. 6, the fifth embodiment can regulate (limit) the flow of the solder 7 and prevent the LED element 3 from turning.

FIG. 9 and the remaining drawings show embodiments that are different from the above-described embodiments in the shape of the strip-like wirings 2 and the orientation of the LED elements 3.

FIG. 9 shows a sixth embodiment. In the sixth embodiment, each of the strip-like wirings 2 has wide parts (large width parts) 2a and narrow parts (small width parts) 2b in the wiring direction. One LED element 3 is disposed on each wide part 2a. The LED elements 3 and the wide parts 2a are inclined 45 degrees relative to the wiring direction of the strip-like wiring 2. With such configuration, the strip-like wirings 2 can be arranged at a higher density, i.e., can be arranged closer to each other in the direction perpendicular to the wiring direction of the wiring 2. Therefore, it is possible to arrange the LED elements 3 at the high(er) density as a whole.

Similar to the first embodiment shown in FIGS. 1 and 2, there are formed two damming grooves 6 between each two adjacent LED elements 3 in the sixth embodiment. The damming grooves 6 extend transversely across the strip-like wiring 2 concerned.

The damming grooves 6 form the non-effusion regions 8 on the narrow parts 2b of the strip-like wirings 2. The wire 5 extending from one LED element 3 on one strip-like wiring 2 is electrically connected to the corresponding narrow part 2b on an adjacent strip-like wiring 2.

FIG. 10 illustrates a seventh embodiment. Similar to the third embodiment shown in FIG. 5(A), one annular damming groove 6 is formed on the narrow part 2b between each two adjacent LED elements 3 in the seventh embodiment. The annular damming groove 6 defines the non-effusion region 8 in the annular damming groove 6.

Figure 11:
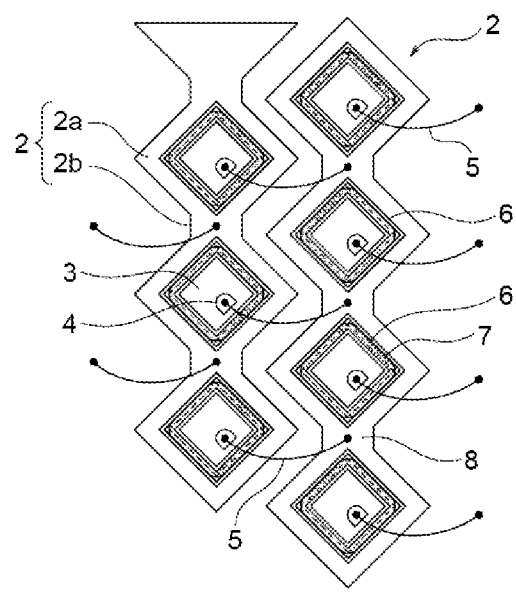
FIG. 11 is a plan view of an eighth embodiment of the present invention.

FIG. 11 illustrates an eighth embodiment. Similar to the fourth embodiment shown in FIGS. 6 and 7, one annular damming groove 6 surrounds one LED element 3 in the eighth embodiment. The non-effusion region 8 is formed on the narrow part 2b outside the annular damming groove 6.

Figure 12:
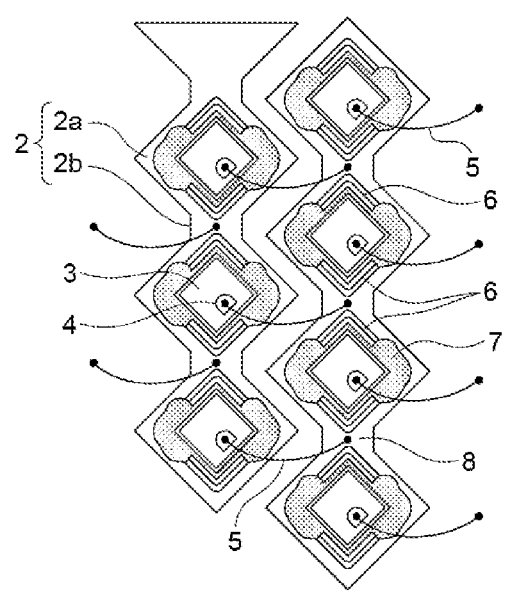
FIG. 12 is a plan view of a ninth embodiment of the present invention.

FIG. 12 illustrates a ninth embodiment. Similar to the fifth embodiment shown in FIG. 8(A), a pair of L-shaped damming grooves 6 are formed in the vicinity of diagonally opposite corners of each LED element 3 in the wiring direction in the ninth embodiment. The two damming grooves 6 are formed outside each LED element 3. The non-effusion region 8 is formed on each narrow part 2b outside the L-shaped damming grooves 6.

Although the LED elements 3 and the wide parts (large parts) 2a of the strip-like wirings 2 are inclined 45 degrees relative to the wiring direction in the embodiments shown in FIGS. 9-14, the present invention is not limited to such configuration. The LED elements 3 and the wide parts 2a of the strip-like wirings 2 may extend in parallel to the wiring direction of the strip-like wirings 2.

Different configurations of the strip-like wiring and the lower face electrode of the LED element will be described with reference to FIGS. 13 and 14.

Figure 13A:
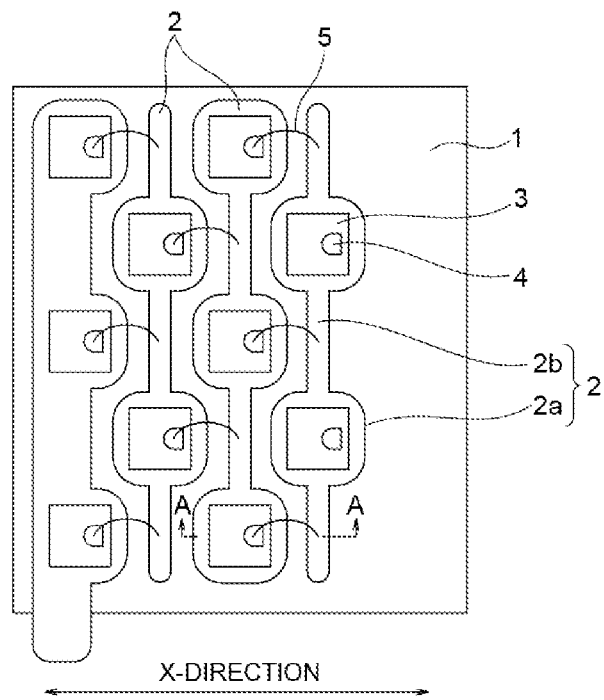
FIG. 13(A) is a plan view of a tenth embodiment of the present invention.
Figure 13B:
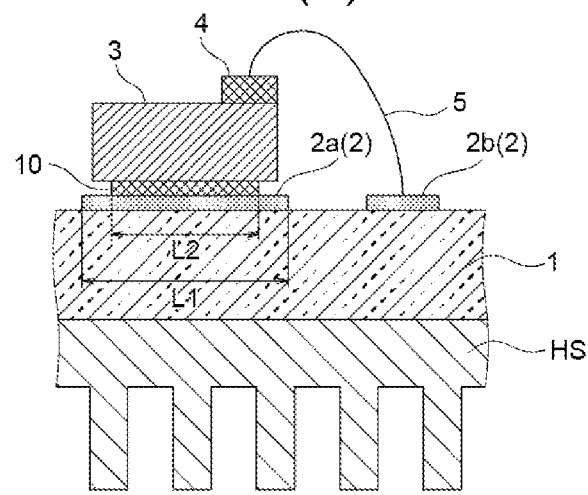
FIG. 13(B) is a partial cross-sectional view taken along the line A-A in FIG. 13(A).

FIG. 13(A) illustrates a top view of the light source unit, and FIG. 13(B) illustrates is an enlarged cross-sectional view of the light source unit, taken along the line A-A in FIG. 13(A).

As shown in FIG. 13(A), the substrate 1 is made from a substance having a high insulation property and a high thermal conductivity, and a plurality of strip-like (band-shaped) metallic wirings 2 are arranged on the substrate 1 at predetermined intervals for insulation (gaps for insulation).

Each of the strip-like wirings 2 has wide parts (large parts) 2a and narrow parts (small parts) 2b alternately in the wiring direction thereof. When two adjacent strip-like wirings 2 are looked at, the wide parts 2a of one strip-like wiring 2 are offset (shifted) from the wide parts 2a of the other strip-like wiring 2 at predetermined distances. Thus, the wide parts 2a of one of the two adjacent strip-like wirings 2 face the narrow parts 2b of the other strip-like wiring 2, and the narrow parts 2b of one strip-like wiring 2 face the wide parts 2b of the other strip-like wiring 2.

The LED elements 3 are placed and coupled onto the wide parts 2a of the strip-like wirings 2. Accordingly, the LED elements 3 have the staggered arrangement on the substrate 1 as a whole.

In the embodiment shown in FIG. 13(A), the LED element 3 has a square shape, and one side of the square extends parallel to the wiring direction of the strip-like wiring 2.

As shown in FIG. 13(B), each of the LED elements 3 has an upper face electrode 4 on its upper face and a lower face electrode 10 on its lower face. The lower face electrode 10 contacts (rests on) the wide part 2a of the strip-like wiring 2 and is connected to the wired part 2a by soldering or the like. Thus, the LED element 2 is electrically connected to the strip-like wiring 2.

One end of the wire 5 is electrically connected to the upper face electrode 4. The wire 5 is made from, for example, gold. The other end of the wire 5 is electrically connected to the narrow part 2b of an adjacent strip-like wiring 2.

As such, each of the strip-like wirings 2 is electrically coupled to an adjacent strip-like wiring 2 via the LED element 2 disposed thereon and the associated wire 5 (wire 5 extending therefrom).

A heat sink HS is provided in contact with the lower face of the substrate 1. Heat from the LED elements 3 is radiated from the heat sink HS via the substrate 1.

In the above-described configuration, it is preferred, from the viewpoints of connection strength to the LED elements 3 and thermal conductivity to the heat sink HS via the substrate 1, that the width L1 of the wide parts 2a of each strip-like wiring 2 is at least greater than the width L2 of the lower face electrode 5 of the LED element 3 (L1>L2), as shown in FIG. 13(B).

If the width of the narrow part 2b of the strip-like wiring 2 is smaller than the width of the LED element 3, it is possible to further reduce the gap between adjacent wirings 2. Thus, the installation density (arrangement density) of the LED elements 3 on the substrate 1 (particularly the installation density of the LED elements 3 in the X-direction that is perpendicular to the wiring 2) can be increased.

Figure 14:
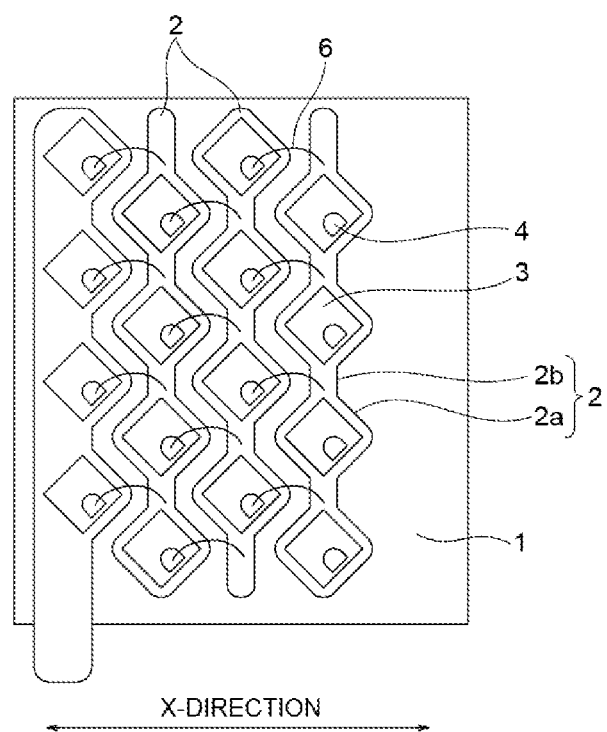
FIG. 14 is a plan view of an eleventh embodiment of the present invention.
Figure 15:
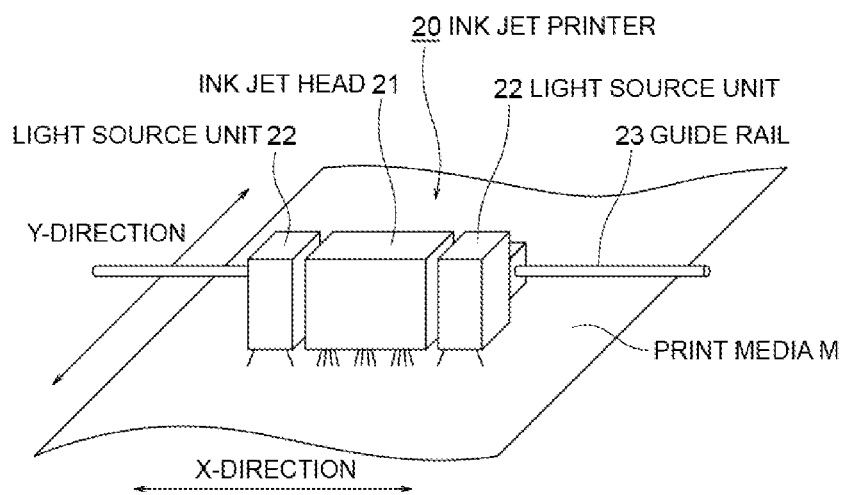
FIG. 15 is a perspective view of a conventional ink jet printer.
Figure 16:
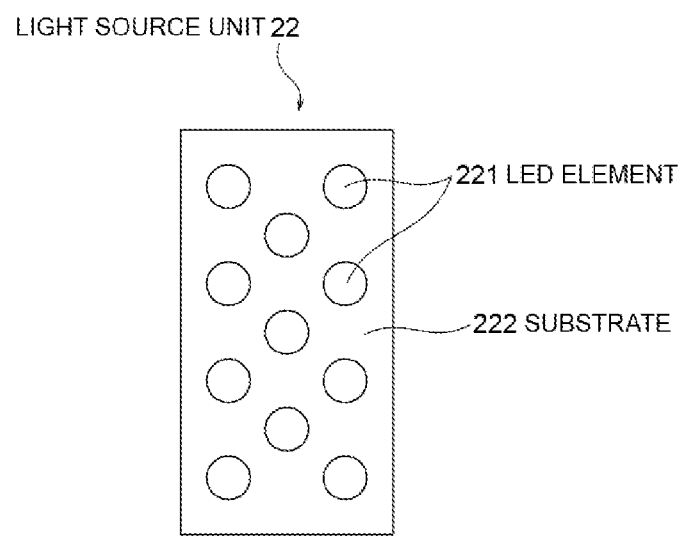
FIG. 16 illustrates a light source unit of the conventional ink jet printer.
Figure 17:
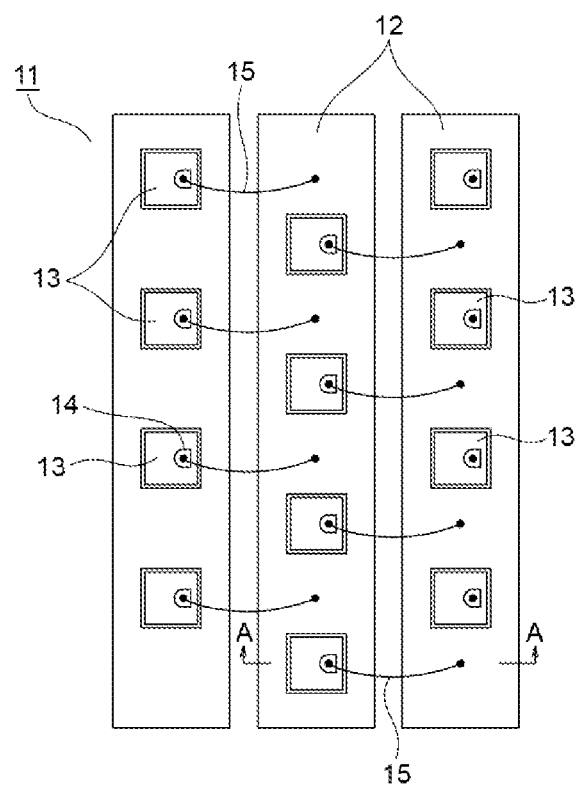
FIG. 17 is a plan view of an example of light source unit.
Figures 18A, 18B:
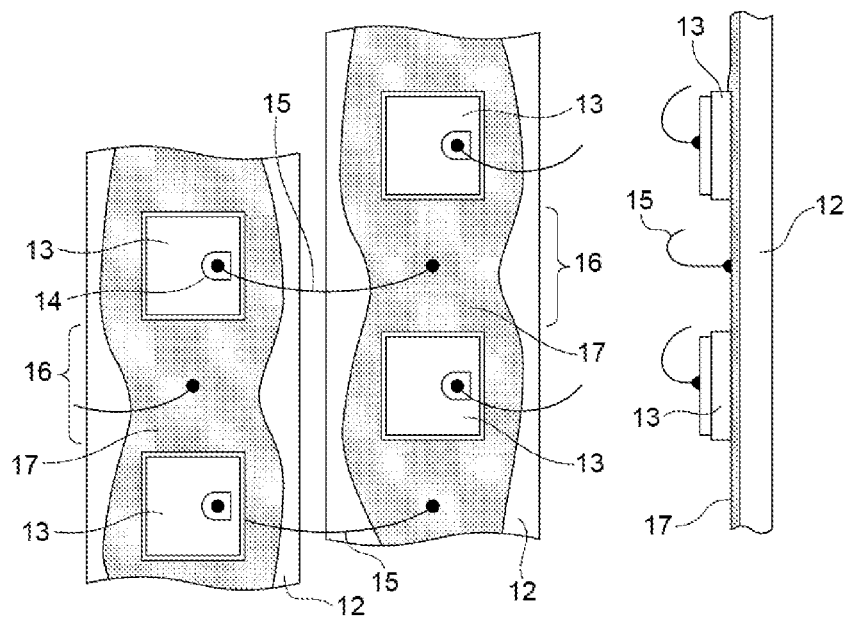
FIG. 18(A) is a partial enlarged view useful to describe problems in the configuration of FIG. 17.
FIG. 18(B) shows a cross-sectional view of FIG. 18(A).
Figure 19:
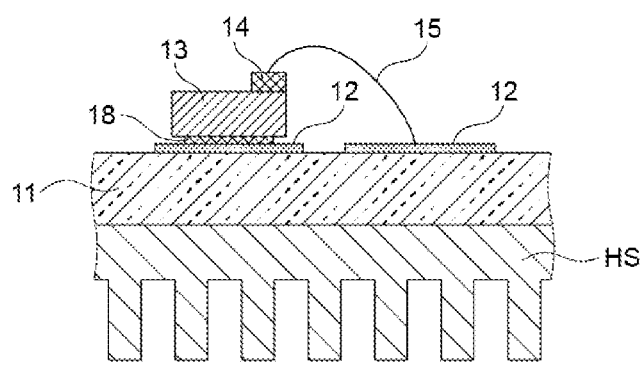
FIG. 19 is a partial cross-sectional view of the light source unit shown in FIG. 17, taken along the line A-A.
Figure 20:
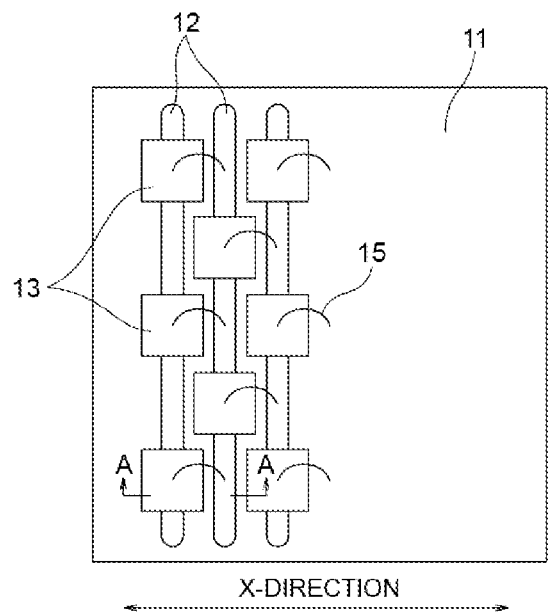
FIG. 20 is a plan view of another example of light source unit.
Figure 21:
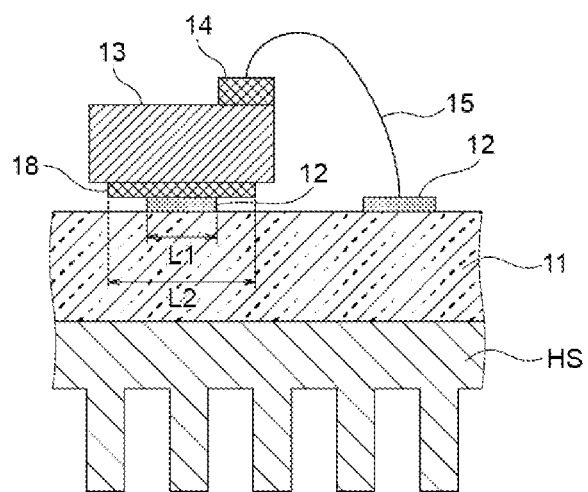
FIG. 21 is a partial cross-sectional view taken along the line A-A in FIG. 20.

FIG. 14 illustrates another embodiment. When this embodiment is compared to the embodiment shown in FIG. 13(A), the LED elements 3 on the strip-like wirings 2 are oriented in the different direction from the LED elements shown in FIG. 13(A). Each of the LED elements 3 has a square shape, and a diagonal line of the square coincides with the wiring direction (longitudinal direction) of the strip-like wiring 2. A diagonal line of the wide part 2a of each strip-like wiring 2 also coincides with the wiring direction.

With the above-described configuration, the embodiment shown in FIG. 14 can arrange the LED elements 3 at a higher density in the wiring direction (longitudinal direction) of the strip-like wiring 2, when compared to the embodiment shown in FIG. 13(A). Thus, it is possible to install the LED elements 3 at the high(er) density in the wiring direction of the strip-like wiring 2 and also in the direction perpendicular to the wiring direction of the strip-like wiring 2.

It should be noted that although the heat sink is provided in contact to the substrate to cool the LED elements in the above-described embodiments, the heat sink may be dispensed with if the LED elements are sufficiently cooled by a cooling wind (air) directed to the substrate.

As described above, the light source unit that includes the LED elements according to one aspect of the present invention has the damming groove(s) on each of the strip-like wirings between each two adjacent LED elements soldered to each of the strip-like wirings, and forms the non-effusion region between each two adjacent LED elements. The non-effusion region is a region into which the solder does not flow. Thus, it is possible to electrically connect the wire, which extends from an LED element on one strip-like wiring, to the non-effusion region on an adjacent strip-like wiring. Accordingly, the problem of poor connection due to the presence of the solder can be avoided.

In some of the embodiments of the present invention, each of the strip-like wirings on the substrate has the wide parts (large parts) and narrow parts (small parts) in the wiring direction, and the wide parts of one strip-like wring face the narrow parts of an neighboring strip-like wiring and the narrow parts of one strip-like wiring face the wide parts of an neighboring strip-like wiring. The LED elements are disposed on the wide parts of the strip-like wirings such that the LED elements are arrange zigzag (in the staggered manner) on the substrate as a whole. In particular, therefore, it is in particular possible to arrange (install) the LED elements at the high density in the direction perpendicular to the wiring direction of the strip-like wirings. This configuration does not hinder the heat transfer from the LED elements to the substrate, and therefore it is possible to efficiently cool the LED elements and avoid the drop of the luminous efficacy.

REFERENCE NUMERALS AND SIGNS

1: Substrate
2: Strip-like wiring
2a: Wide part
2b: Narrow part
3: LED element
4: Upper face electrode
5: Wire
6: Damming groove
7: Solder
8: Non-effusion region
9: Dot-like concave
10: Lower face electrode
HS: Heat sink

The invention claimed is:

1. A light source unit comprising:
a substrate;
a plurality of parallel strip-like wirings on the substrate;
a plurality of LED elements disposed on each said strip-like wiring, said LED elements soldered on a first one of the strip-like wirings being electrically connected to a second adjacent one of the strip-like wirings by wires respectively, said plurality of LED elements being arranged zigzag on the substrate as a whole; and
a plurality of damming grooves formed in each said strip-like wiring, at least one said damming groove being provided between each two adjacent said LED elements on each said strip-like wiring such that a non-effusion region, into which no solder flows, is formed between said each two adjacent LED elements, said wires being connected to the non-effusion regions.

2. The light source unit according to claim 1, wherein the damming grooves include at least two damming grooves between said each two adjacent LED elements on each said strip-like wiring, said at least two damming grooves extending transversely across the strip-like wiring concerned, and forming the non-effusion region between said at least two damming grooves.

3. The light source unit according to claim 2, wherein each of said at least two damming grooves includes a series of dot-like concaves that extend transversely across the strip-like wiring concerned.

4. The light source unit according to claim 2, wherein said at least two damming grooves include four damming grooves such that two of the four damming grooves are associated with one of said each two adjacent strip-like wirings and remaining two of the four damming grooves are associated with the other of said each two adjacent strip-like wirings.

5. The light source unit according to claim 2, wherein said at least two damming grooves include six damming grooves such that three of the six damming grooves are associated with one of said each two adjacent strip-like wirings and remaining three of the six damming grooves are associated with the other of said each two adjacent strip-like wirings.

6. The light source unit according to claim 1, wherein each of the damming grooves includes an annular groove formed between said each two adjacent LED elements on each said strip-like wiring, and each said annular groove forms each said non-effusion region therein.

7. The light source unit according to claim 1, wherein each of the damming grooves includes an annular groove that surrounds each said LED element, and each said annular groove forms each said non-effusion region outside the annular groove.

8. The light source unit according to claim 1, wherein the damming grooves include L-shaped grooves formed in the outside vicinity of diagonally opposite corners of each said LED element, each said non-effusion region being formed outside the L-shaped grooves.

9. The light source unit according to claim 1 further including a heat sink below the substrate.

10. A light source unit comprising:
a substrate;
a plurality of parallel strip-like wirings on the substrate; and
a plurality of LED elements disposed on each said strip-like wiring, said LED elements on a first one of the strip-like wirings being electrically connected to a second adjacent one of the strip-like wirings by wires respectively, said plurality of LED elements being arranged zigzag on the substrate as a whole,
each said strip-like wiring having wide parts and narrow parts in a wiring direction, and said LED elements being disposed on the wide parts of the strip-like wirings.

11. The light source unit according to claim 10, wherein the LED elements are soldered on the strip-like wirings, and a plurality of damming grooves are formed in each said strip-like wiring such that at least one said damming groove is provided between each two adjacent said LED elements on each said strip-like wiring, and non-effusion regions, into which no solder flows, are formed on the narrow parts.

12. The light source unit according to claim 11, wherein the damming grooves include at least two damming grooves between said each two adjacent LED elements on each said strip-like wiring, said at least two damming grooves extending transversely across the strip-like wiring concerned and forming the non-effusion region between said at least two damming grooves.

13. The light source unit according to claim 10, wherein each said wide part of each said strip-like wiring is wider than a lower face electrode provided on a lower face of each said LED element, the lower face electrode being in contact with the associated strip-like wiring.

14. The light source unit according to claim 10, wherein each said narrow part of each said strip-like wiring is narrower than each said LED element.

15. The light source unit according to claim 10, wherein each said LED element has a square shape, and one side of the square shape is parallel to the wiring direction of the strip-like wirings.

16. The light source unit according to claim 10, wherein each said LED element has a square shape, and a diagonal line of the square shape coincides with the wiring direction of the strip-like wirings.

17. The light source unit according to claim 10 further including a heat sink below the substrate.

* * * * *